(12) United States Patent
Lu et al.

(10) Patent No.: US 10,109,551 B2
(45) Date of Patent: Oct. 23, 2018

(54) METHODS AND APPARATUSES FOR DETERMINING A PARAMETER OF A DIE

(71) Applicant: Intel Corporation, Santa Clara, CA (US)

(72) Inventors: Cho-Ying Lu, Hillsboro, OR (US); Matthias Eberlein, Holzkirchen (DE); Hyung-Jin Lee, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 241 days.

(21) Appl. No.: 14/854,487

(22) Filed: Sep. 15, 2015

(65) Prior Publication Data
US 2017/0074924 A1    Mar. 16, 2017

(51) Int. Cl.
*H01L 23/34* (2006.01)
*H01L 27/16* (2006.01)

(52) U.S. Cl.
CPC ............. *H01L 23/34* (2013.01); *H01L 27/16* (2013.01)

(58) Field of Classification Search
CPC ................................ H01L 23/34; H01L 27/16
USPC .. 324/500, 750.3, 757.04, 762.03, 600, 663, 324/671, 200, 207.13, 207.22, 239, 241, 324/515, 520, 530
See application file for complete search history.

(56) References Cited

U.S. PATENT DOCUMENTS

| 6,996,491 | B2 | 2/2006 | Gold et al. | |
| 2003/0158697 | A1* | 8/2003 | Gold | ........................ G06F 1/206 |
| | | | | 702/132 |
| 2013/0120930 | A1* | 5/2013 | Temkine | .................. G06F 1/206 |
| | | | | 361/679.47 |
| 2013/0228632 | A1* | 9/2013 | Kapoor | .............. G05D 23/1917 |
| | | | | 236/94 |

(Continued)

FOREIGN PATENT DOCUMENTS

WO          2015012798 A1      1/2015

OTHER PUBLICATIONS

Eberlein, M., "Ultra-Compact Thermal Sensor in 28NM Enabling Flexible and Precision Measurement," DTTC 2013, 7 pages.

(Continued)

*Primary Examiner* — Melissa Koval
*Assistant Examiner* — Trung Nguyen
(74) *Attorney, Agent, or Firm* — Schwabe, Williamson & Wyatt, P.C.

(57) ABSTRACT

Embodiments of the present disclosure provide techniques and configurations for integrally determining a parameter (e.g., temperature) of a die of an integrated circuit. In one instance, the apparatus may comprise a die including a first (e.g., remote) area and a second (e.g., local) area disposed at a distance from the first area, and circuitry to determine a parameter associated with the remote area of the die. The circuitry may include: a first sensing device disposed in the remote area, to provide first readings associated with the parameter; a second sensing device disposed in the local (Continued)

area, to provide second readings associated with the parameter; and a control module coupled with the sensing devices and disposed in the local area, to facilitate a determination of the parameter based on the first and second readings provided by the first and second sensing devices. Other embodiments may be described and/or claimed.

14 Claims, 5 Drawing Sheets

(56) References Cited

U.S. PATENT DOCUMENTS

2014/0105246 A1    4/2014   Andreev et al.
2015/0030051 A1    1/2015   Cortigiani et al.

OTHER PUBLICATIONS

International Search Report and Written Opinion dated Nov. 10, 2016, issued in corresponding International Application No. PCT/US2016/045359, 19 pages.

International Preliminary Report on Patentability dated Mar. 29, 2018, issued in corresponding International Application No. PCT/US2016/045359, 16 pages.

* cited by examiner

METHODS AND APPARATUSES FOR DETERMINING A PARAMETER OF A DIE

FIELD

Embodiments of the present disclosure generally relate to the field of sensor-equipped devices, and more particularly, to techniques for onboard or integral determining of parameters of a die in integrated circuits.

BACKGROUND

Digital temperature sensor circuit systems (DTS) are used in many integrated circuit products to provide the temperature information of the die (e.g., silicon die) to be used for system optimization or damage protection. Typically, several DTS may be placed in a single die to detect the temperature information from different locations in the multi-core and multi-standard products in order to perform optimization and protection for individual core or system in parallel. However, the form factor of the DTS makes it difficult for it to be placed in the device-dense core area of the die, which may contain central processing unit (CPU) circuitry, for example. The concept of remote sensing was, therefore, proposed and implemented to reduce the silicon requirement in the highly dense core area.

The current remote sensing solutions place at least two temperature sensing devices in the remote (e.g., device-dense or congested) area of the die. These two or more temperature sensing devices may serve to provide temperature coefficients from the dedicated area.

However, the dimensions of temperature sensing devices may require substantial use of space in the remote area of the die. Furthermore, routings with low resistance to ensure the desired temperature coefficient purities may be needed to connect the sensing devices with the processing circuitry in the input-output (IO) area of the integrated circuit. These routings may also consume substantial space in the die.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
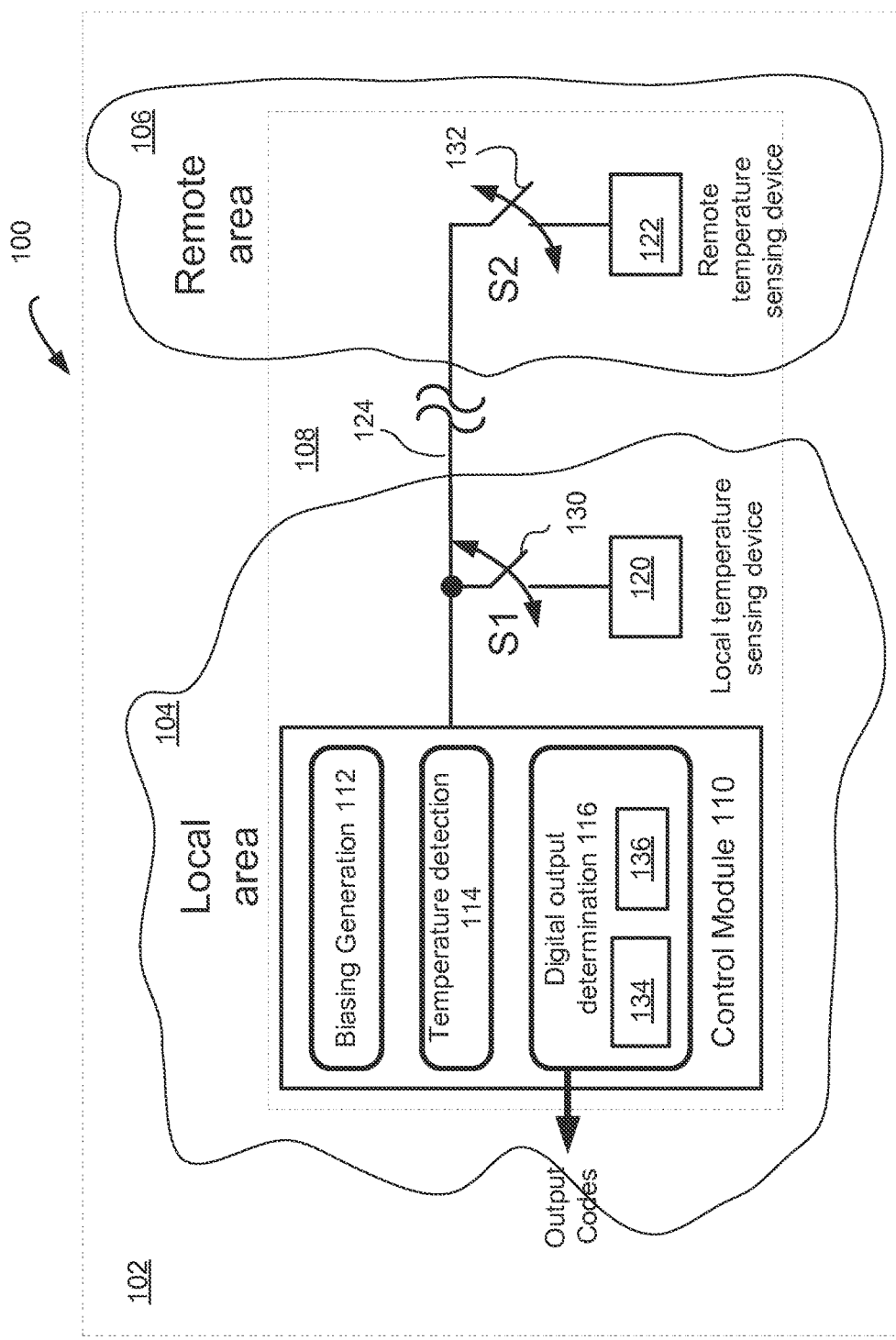
FIG. 1 is a block diagram illustrating an example apparatus incorporated with the teachings of the present disclosure, in accordance with some embodiments.

Embodiments of the present disclosure include techniques and configurations for onboard or integral determining of a parameter (e.g., temperature) of a die of an apparatus, such as an integrated circuit. In accordance with embodiments, the apparatus may comprise a die including a first (e.g., remote, e.g., device-dense) area and a second (e.g., local, e.g., density-relaxed) area disposed at a distance from the first area, and circuitry to determine a parameter associated with the remote area of the die. The circuitry may include a first sensing device disposed in the remote area, to provide first readings associated with the parameter; a second sensing device disposed in the local area, to provide second readings associated with the parameter; and a control module coupled with the first and second sensing devices and disposed in the local area, to facilitate a determination of the parameter based at least in part on the first and second readings provided by the first and second sensing devices.

In the following detailed description, reference is made to the accompanying drawings that form a part hereof, wherein like numerals designate like parts throughout, and in which are shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), (A) or (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical, electrical, or optical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

FIG. 1 is a block diagram illustrating an example apparatus 100 incorporated with the teachings of the present disclosure, in accordance with some embodiments. The apparatus 100 may comprise an integrated circuit (IC) disposed in a die 102. The die 102 may comprise a semiconductor material, such as silicon.

In embodiments, the die 102 may comprise a central processing unit (CPU), a graphics processing unit (GPU), a memory controller and/or a bus controller. Further, the apparatus 100 may include corresponding circuitry (e.g., connectivity devices, input-output devices and the like) to incorporate the die 102 in a computing device e.g., a stationary or mobile device (e.g., a desktop computer, a laptop computer, a tablet computer, a smartphone, a 1-in-2 computing device, and the like), a wearable device, or any other electronic computing device.

In embodiments, the apparatus 100 may be configured to integrally determine a parameter associated with the die 102. The parameter may be a temperature of the die 102, for example. The determination of the temperature of the die 102 may be important for protection of the circuitry disposed in the die 102 from over-heating or burning during the operation. For example, when the temperature of the die, determined using techniques described herein, passes a pre-determined threshold, the system (e.g., apparatus 100) may slow down or temporarily power down to cool down the circuitry disposed in the die 102.

In another example, the determination of the temperature of the die 102 may be used to optimize the system performance. The system may automatically adjust the circuit to optimize the performance based on the temperature determined using techniques described herein.

In summary, a computing product, such as CPU/GPU and/or connectivity chip packaged in the die 102, may be protected from damage, or its function may be optimized, by dynamically determining the temperature associated with the die 102, as described in embodiments herein.

In embodiments, the die 102 of the apparatus 100 may include a local area 104 (density-relaxed area) and a remote area 106 (device-dense or congested area) disposed at a distance from the local area, such, as for example, at about 500 micrometers (um) or more. In some embodiments, the remote area 106 of the die 102 may include a central processing unit (CPU) or a graphics processor unit (GPU) disposed in this area.

In some embodiments, the remote area 106 may have a density of electronic devices per unit of space that may be above a first density threshold. The local area may have a second density of electronic devices per unit of space that is below a second density threshold, where the first density threshold may be equal or greater than the second density threshold. In other words, the remote area 106 may be more device-dense than the local area 104, due to disposition of device-dense circuits, such as CPU or GPU in the remote area 106.

Generally, the remote area 106 may be an area of the die 102 in which performance (e.g., operational speed) may be more important than in in other areas of the die 102, such as the local area 104. For example, digital circuit areas of the die 102 may comprise areas (e.g. remote area 106) where the circuit operational speed may be important for performance. Therefore, it may be beneficial to optimize (e.g., minimize) a presence of temperature sensing devices that may occupy substantial space in the remote area 106, as provided in the present disclosure. According to some embodiments of the present disclosure described herein, a single sensing device, e.g., temperature sensing device may be used in the remote area to determine a parameter associated with the remote area 106 of the die 102, such as temperature of the die 102.

In embodiments, the die 102 may further comprise circuitry 108 to determine a parameter associated with the remote area 106 of the die 102, such as temperature of the die 102. The circuitry 108 may include: a first sensing device 120 disposed in the local area 104, to provide first readings associated with the parameter of the die 102. The circuitry 108 may further include a second sensing device 122 disposed in the remote area 106, to provide second readings associated with the parameter. The sensing devices 120, 122 may be any suitable temperature sensing devices. More specifically, the sensing devices 120, 122 may include a resistor, a thermal diode, a bipolar junction transistor (BJT), or a subthreshold transistor.

The CPU core area comprising remote area 106 may not provide suitable power supply for temperature sensing devices and corresponding circuitry in the remote area 106. Voltage supply for temperature sensing devices may be different than voltage supply for circuits disposed in the remote area. For example, remote area 106 may require lower (or higher) voltage supply for circuits disposed therein than the voltage supply needed for temperature sensing devices. Using one sensing device (sensing device 122) in the remote area 106 as provided herein may not require a special power supply or a clock circuitry in the remote area 106 to support the remote sensing.

The circuitry 108 may further include a control module 110 coupled 124 with the first and second sensing devices 120 and 122 and disposed in the local area 104, to facilitate a determination of the parameter based at least in part on the first and second readings provided by the first and second sensing devices 120 and 122. As shown, the control module 110 may include a biasing generation component 112 to generate direct current (DC) bias for the circuitry 108, including sensing devices 120, 122. The control module 110 may further include a temperature detection component 114 configured to detect first and second readings provided by the first and second sensing devices 120 and 122. The control module 110 may further include a digital output determination component 116 configured to determine and provide output codes C1 and C2, based on the first and second readings of the first and second sensing devices 120 and 122 respectively. The output codes C1 and C2 may be digital codes indicative of the parameter (e.g., temperature) in the remote area 106 of the die 102, that is to be further determined based on the output codes C1 and C2 as described below.

In embodiments, the digital output determination component 116 may be implemented as a logic engine, which may comprise a firmware implementation or a combination of hardware and software implementations, such as a controller having a processor 134 and memory 136 to store instructions for controlling the sensing devices 120, 122 and determining digital output of the control module 110, executable on the processor 134. In some embodiments, the logic engine may employ an available CPU included in the apparatus 100 (e.g., in the remote area 106, not shown).

Figure 2:
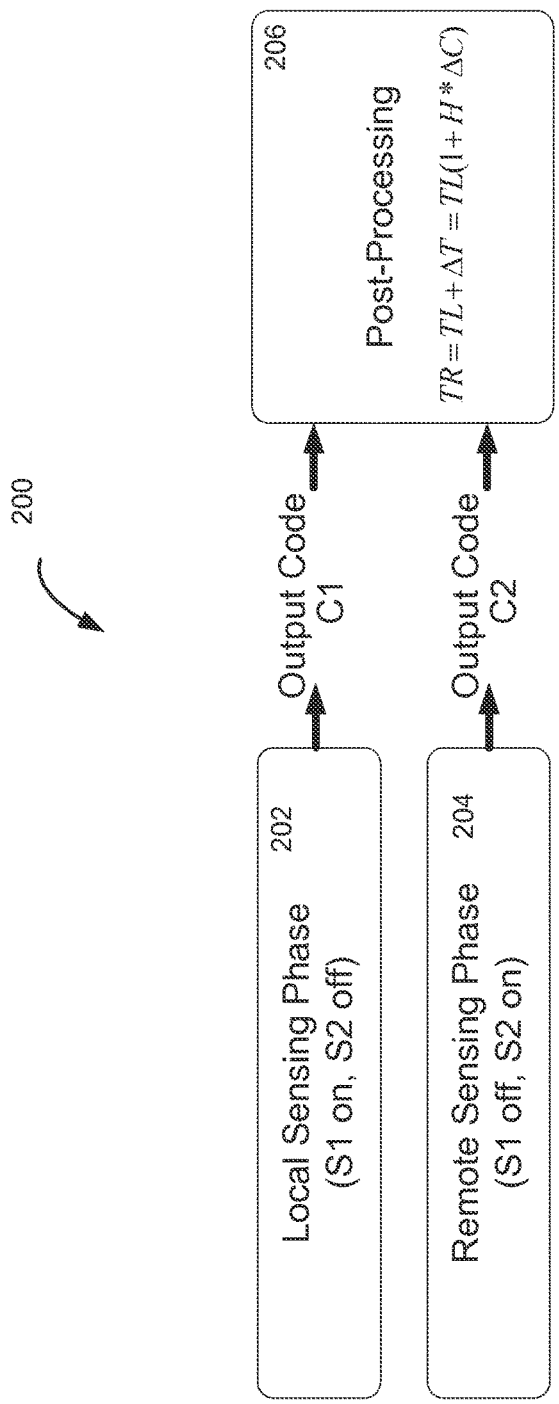
FIG. 2 is a process flow diagram for remote sensing and subsequent derivation of a parameter of a remote area in the apparatus described in reference to FIG. 1, in accordance with some embodiments.

The circuitry 108 may further include a first switch S1 130 coupled with the first sensing device 120, and a second switch S2 132 coupled with the second sensing device 122, to enable selective connectivity of the first and second sensing devices 120, 122 with the control module 110, described in greater detail in reference to FIG. 2.

The operation of the apparatus 100 will be described in reference to FIGS. 2-4.

FIG. 2 is a process flow diagram for remote sensing and subsequent derivation of a parameter of a remote area in the apparatus described in reference to FIG. 1, in accordance with some embodiments. The process 200 may comport with some of the apparatus embodiments described in reference to FIG. 1. In alternate embodiments, the process 200 may be practiced with more or fewer operations, or a different order of the operations, for example, actions described in reference to blocks 202 and 204 may be performed in any order. In embodiments, the process 200 may be implemented as a control module 110 of FIG. 1.

The process 200 may begin at block 202, where a local sensing phase of the process 200 may commence. More specifically, in the local sensing phase, the local temperature (TL) may be detected in the local area 104 of the die 102. An output code C1 indicative of TL may be generated. The local sensing phase of block 202 may be enabled by turning switch S1 130 on and connecting first sensing device 120 with the control module 110, and turning switch S2 132 off and disconnecting the second sensing device 122 from the control module 110.

At block 204, a remote sensing phase may commence. In the remote sensing phase, the remote temperature (TR) may be detected in the remote area 106 of the die 102 by turning switch S1 130 off and disconnecting first sensing device 120 from the control module 110, and turning switch S2 132 on and connecting the second sensing device 122 with the control module 110. An output code C2 may be generated, reflecting local temperature TL and remote temperature TR, or more specifically, a difference ΔT between TL and TR.

As known, remote sensing may be based on the comparison between two temperature-dependent parameters in order to figure out the actual temperature in an area of die. Such temperature-dependent parameters may include positive-to-absolute-temperature (PTAT), complementary-to-absolute-temperature (CTAT), or a combination thereof. For example, a combination of temperature parameters used to derive temperature in the remote area 106 may be two PTAT parameters, two CTAT parameters, one PTAT and one CTAT parameter, PTAT with temperature-independent parameter or CTAT with temp-independent parameter. In the example embodiments described herein, temperature of the remote area 106 may be determined based on a combination of one PTAT and one CTAT parameters. During the remote sensing phase described in reference to block 204, the PTAT parameter is based on the local temperature TL and the CTAT parameter is based on the remote temperature TR to derive the output code C2. Accordingly, C2 may be generated based on both TL and TR. It should be noted that the embodiments described herein are not limited to the PTAT and CTAT combination, which is used for illustration purposes only. In some embodiments, the DTS may be used to determine two PTAT parameters or two CTAT parameters and the code C2 may be generated accordingly.

At block 206, the output codes C1 and C2 may be provided for post-processing, to derive TR. In embodiments, TR may be determined based on the following equation:

$$TR=TL+\Delta T=TL(1+H*\Delta C) \quad (1)$$

where ΔC is the output code difference, TL is temperature sensed by first sensing device 120, and H is a process parameter available from pre-manufacture testing as described below. In some embodiments, post-processing may be accomplished by a CPU disposed in the remote area 106 or other accessible computing device. In some embodiments, the post-processing may be accomplished at the control module 110, e.g., by digital output determination component 116.

Figure 3:
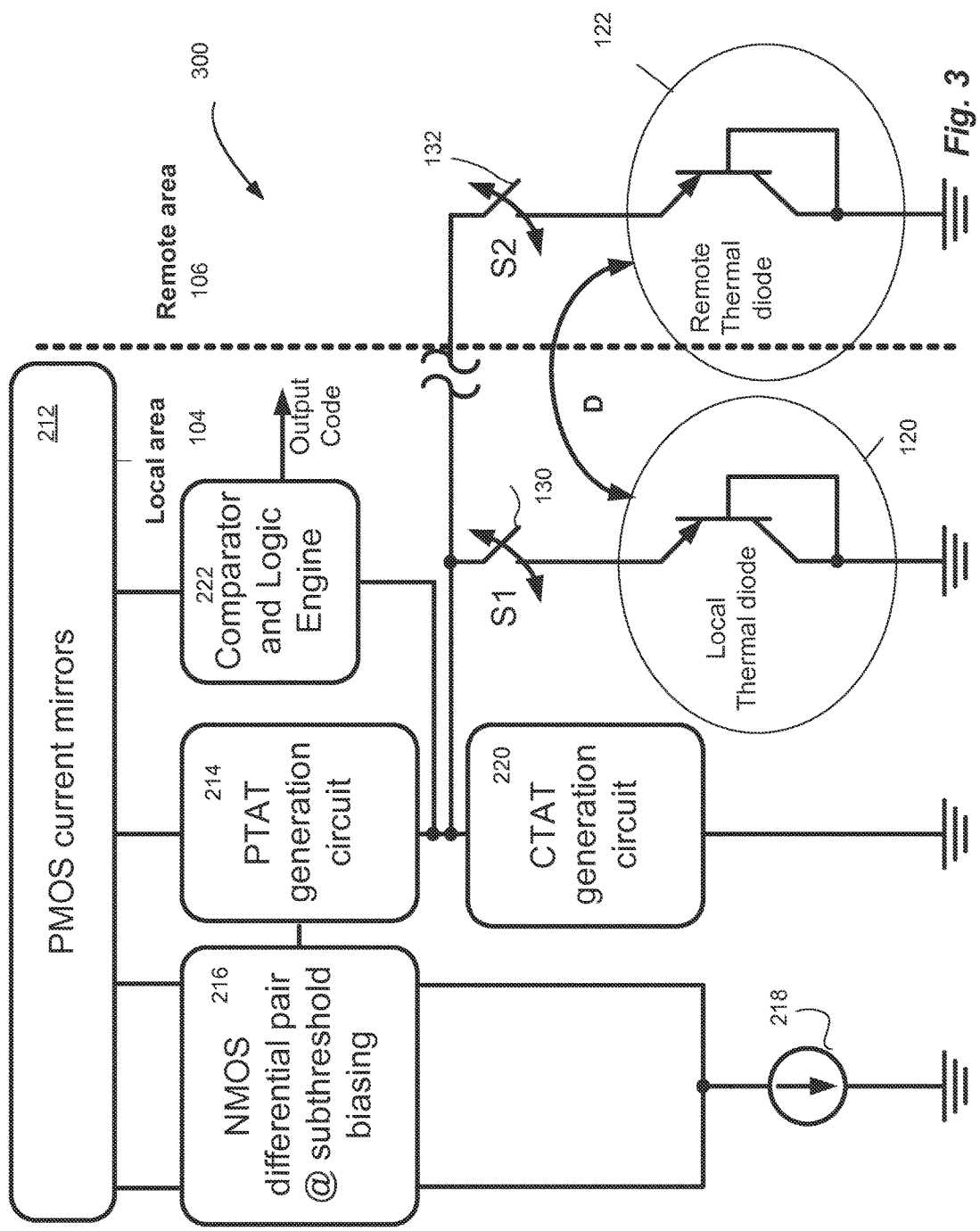
FIG. 3 is a schematic diagram of an example implementation of aspect of the die of FIG. 1, in accordance with some embodiments.

FIG. 3 is a schematic diagram of an example implementation of aspects of the die 102 of FIG. 1, in accordance with some embodiments. More specifically, FIG. 3 is the example implementation of the circuit architecture 300 configured to provide remote sensing described in reference to FIGS. 1 and 2. For simplicity purposes, like components of FIGS. 1 and 3 will be designated with like numeral. For example, first and second sensing devices of FIG. 1 may be implemented as thermal diodes or BJT 120 and 122 that may be placed at a distance D from each other in the local and remote areas 104 and 106 respectively. In embodiments, the distance D may be about 500 nm.

The biasing generation component 112 may be implemented as P-type metal-oxide-semiconductor (PMOS) current mirrors circuit 212, providing DC bias for the implementation 300.

The temperature detection component 114 may be implemented as circuitry configured to provide temperature parameters, such as positive-to-absolute-temperature (PTAT), complementary-to-absolute-temperature (CTAT), and temperature-independent coefficients from the dedicated areas, e.g., PTAT from the local area 104 and CTAT from the local and remote area 106. The circuitry 300 may include a PTAT generation circuit 214 that may include an N-type metal-oxide-semiconductor (NMOS) differential pair and subthreshold biasing component 216 configured to provide a mirrored current source 218. In order to support the circuit in proper DC bias condition, current mirrors 212 and 218 may comprise the bias generation circuitry to provide proper DC current values to all other blocks of the circuitry 300 to ensure that the circuitry components, such as temperature sensing devices are biased at the appropriate condition. The circuitry 300 may further comprise a CTAT generation circuit 220 configured to generate CTAT parameters for local and remote areas 104 and 106.

The digital output determination component 116 may be implemented as comparator and logic engine 222, to compare the parameters provided by the sensing devices 120 and 122, and PTAT and CTAT generation circuits 214, 220, and provide output codes C1 and C2 as described below in greater detail. More specifically, blocks 216 and 214 may be used to generate the PTAT parameter. Circuit 216 may provide the PTAT device coefficients and circuit 214 may convert these coefficients to the appropriate format for comparison at comparator and logic engine 222. CTAT generation circuits 220 may also be used to convert the CTAT device coefficients from either 122 or 120 into the appropriate format for comparison at comparator and logic engine 222. The comparator and logic engine 222 may include the comparator to compare the converted PTAT parameter from block 214 and converted CTAT parameter from block 220 as well as all the logics to provide the digital output based on the comparison result from comparator to an external system (not shown). The comparator and logic engine 222 may implement control over switches S1 130 and S2 132 according to the process described in reference to FIG. 2. For example, S1 130 and S2 132 may be turned on and/or off based on the operation phase of FIG. 2, respectively.

In the local and remote sensing phases, the apparatus 100 implemented as shown in FIG. 3 may generate the output codes C1 and C2, respectively, based on the following equations:

$$TL*J*C1-TL*kt=V_{EB0} \quad (2)$$

$$TL*J*C2-TR*kt=V_{EB0} \quad (3)$$

where J is the combined parameter from various physic constants, $V_{EB0}$ is the emitter to base voltage of a BJT at 0 K temperature, kt is a voltage slope to temperature of the thermal diode. The temperature difference (ΔT=TR−TL) may be derived from the code difference (ΔC=C2−C1), by subtracting equation (2) from equation (1). The desired temperature TR may be determined, as indicated by equation (1), as follows:

$$TR = TL + \Delta T = TL\left(1 + \frac{J}{kt}*\Delta C\right) \quad (4)$$

where J and kt may be determined from the temperature-controlled tests for different temperatures (e.g., "sort" (e.g., cold, such as −10° C.) and "class" (e.g., hot, such as 80° C.)), and stored for post-processing as equation (4). The temperature-controlled tests may include standard tests defined by the following equations:

$$TL_{sort} * J * C_{sort} - TL_{sort} * kt = V_{EB0} \quad (5)$$

$$TL_{hot} * J * C_{class} - TL_{hot} * kt = V_{EB0} \quad (6)$$

$$\frac{V_{EB0}}{J} = \frac{C_{class} - C_{sort}}{\left(\frac{1}{TL_{sort}} - \frac{1}{TL_{class}}\right)} \quad (7)$$

where $TL_{sort}$ is the "sort" (generally, cold) temperature, which may be controlled during testing;

$TL_{class}$ is the "class" (generally, hot) temperature, which may be controlled during testing;

J is the device-based constant parameter, temperature-independent;

Kt is temperature slope of the CTAT parameter;

$V_{EB0}$ is the CTAT parameter value when temperature of the die is 0 degree K. Typically, $V_{EB0}$ may be the extrapolate value.

Kt and $V_{EB0}$ may be related to the same temperature sensing device (e.g., BJT) and have strong correlation. Because Kt and $V_{EB0}$ have strong correlation, Kt may be determined based on $V_{EB0}$, which may be derived from equation (7). However, as discussed above, the described embodiments are not limited to BJT implementation as a temperature sensing device. Other temperature sensing devices, i.e. resistors, etc. may be used in the implementation similar to FIG. 3. Different temperature sensing devices may need different equations to acquire the device parameters.

It should be noted that the coefficient derivation in order to determine TR is described above for illustration purposes only. In embodiments, coefficients J and kt may be acquired, for example during the standard product trimming flow (preliminary testing) and stored (e.g., in non-volatile memory of an external computing device) for post-processing. As known, die may be pre-tested and the circuit configuration may be pre-tuned through digital control to recover the circuit performance, which may be degraded by the manufacturing variation. In order to verify the circuit performance in different temperatures, the tests generally happen at multiple temperatures, some of which ("cold" and "hot") described above.

Figure 4:
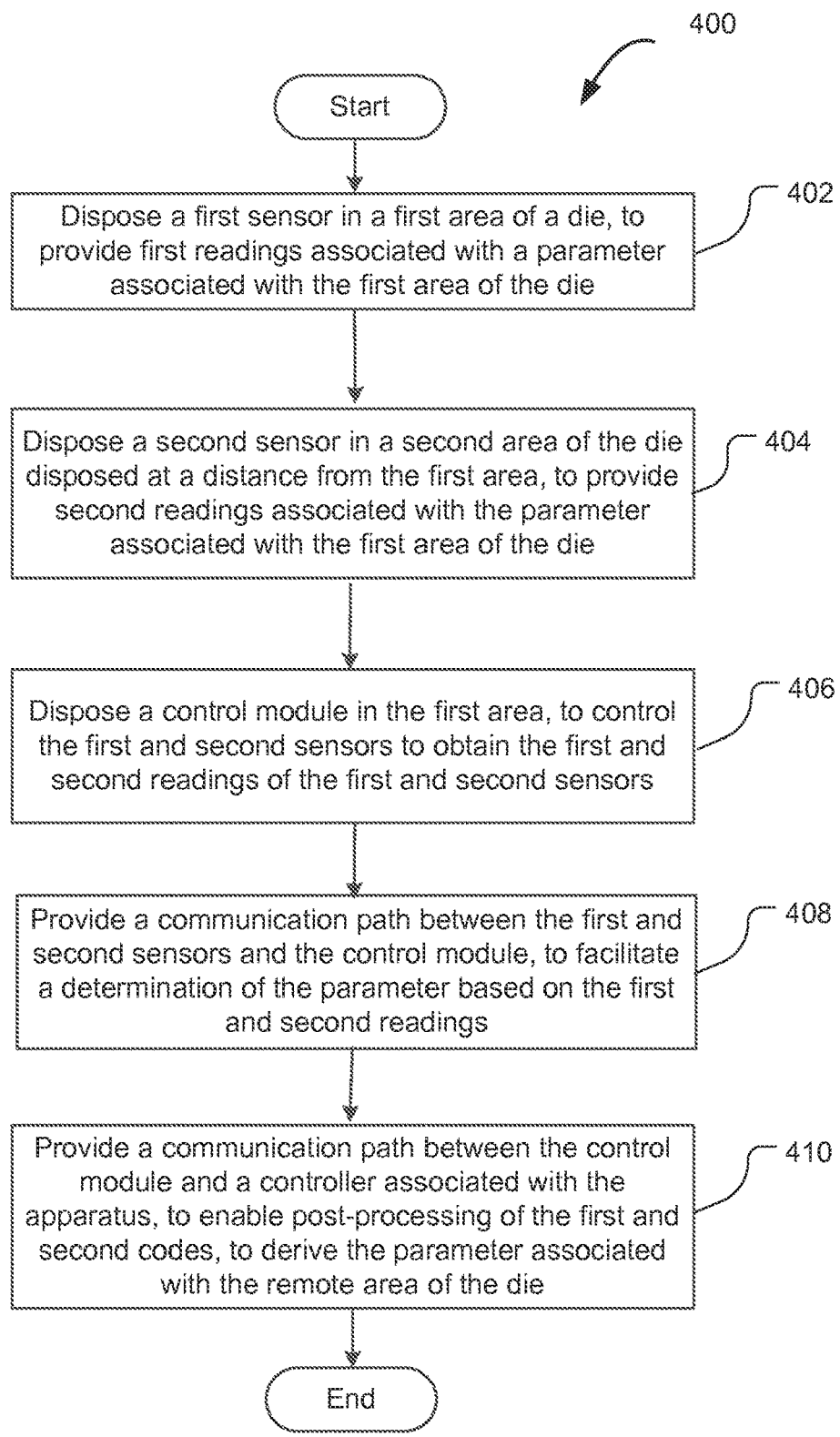
FIG. 4 is a process flow diagram for determining a parameter of a die in the apparatus of FIG. 1, in accordance with some embodiments.

FIG. 4 is a process flow diagram for determining a parameter of a die in an apparatus, in accordance with some embodiments. The apparatus may comport with embodiments of the apparatus 100 described in reference to FIGS. 1 and 2.

The process 400 may begin at block 402, and include disposing a first sensing device in a first area of a die, to provide first readings associated with a parameter associated with the first area of the die. The first area may be a local area 104 of the die 102 of FIG. 1.

At block 404, the process 400 may include disposing a second sensing device in a second area of the die disposed at a distance from the first area, to provide second readings associated with the parameter associated with the first area of the die. The second area may be the remote area 106 of the die 102 of FIG. 1.

At block 406, the process 400 may include disposing a control module in the first area, to control the first and second sensing devices to obtain the first and second readings of the first and second sensing devices.

At block 408, the process 400 may include providing a communication path between the first and second sensing devices and the control module, to facilitate a determination of the parameter based at least in part on the first and second readings provided by the first and second sensing devices to the control module.

Disposing the sensing devices and communication paths described in blocks 404 and 406 may include disposing a first switch to couple with the first sensing device, and disposing a second switch to couple with the second sensing device, to enable selective connection of the first and second sensing devices with the control module via the communication path using the first and second switches respectively, to obtain the first and second readings from the sensing devices, and to generate first and second codes indicative of the parameter, based at least in part on the obtained first and second readings respectively.

At block 410, the process 400 may include providing a communication path between the control module and a controller associated with the apparatus, to enable post-processing of the first and second codes, to derive the parameter associated with the remote area of the die.

Figure 5:
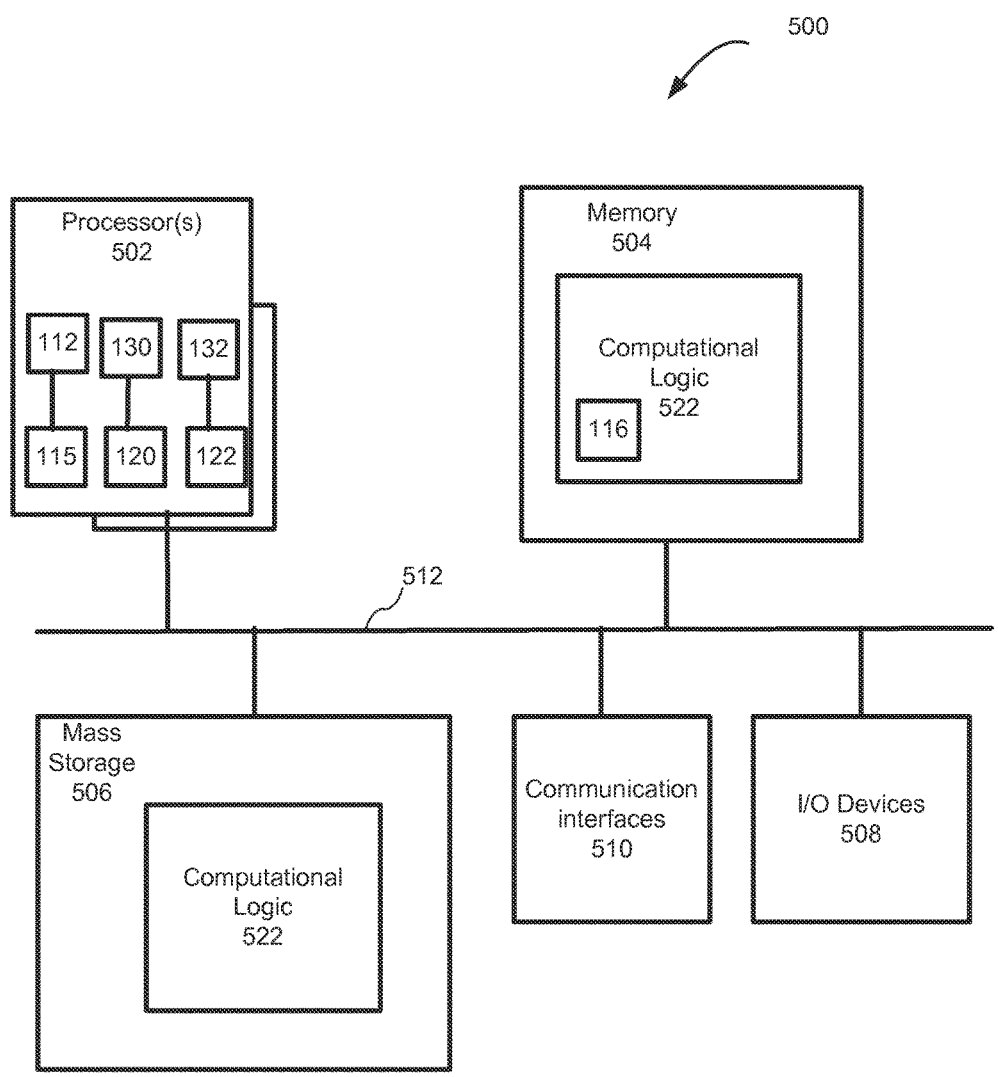
FIG. 5 is an example computing device suitable to be configured as the apparatus of FIGS. 1 and 3 in accordance with various embodiments.

FIG. 5 is an example computing device 500 suitable to be configured as the apparatus of FIG. 1 in accordance with various embodiments. In some embodiments, various components of the example computing device 500 may be used to configure the apparatus 100.

As shown, computing device 500 may include one or more processors or processor cores 502 and system memory 504. For the purpose of this application, including the claims, the terms "processor" and "processor cores" may be considered synonymous, unless the context clearly requires otherwise. The processor 502 may include any type of processors, such as a central processing unit (CPU), a microprocessor, and the like. The processor 502 may be implemented as an integrated circuit having multi-cores, e.g., a multi-core microprocessor. The computing device 500 may include mass storage devices 504 (such as solid state drives, volatile memory (e.g., dynamic random-access memory (DRAM), and so forth)). In general, system memory 504 and/or mass storage devices 506 may be temporal and/or persistent storage of any type, including, but not limited to, volatile and non-volatile memory, optical, magnetic, and/or solid state mass storage, and so forth. Volatile memory may include, but is not limited to, static and/or dynamic random-access memory. Non-volatile memory may include, but is not limited to, electrically erasable programmable read-only memory, phase change memory, resistive memory, and so forth. System memory 504 and/or mass storage devices 506 may include respective copies of programming instructions configured to perform computational operations, collectively denoted as computational logic 522. The programming instructions may be assembler instructions supported by processor(s) 502 or high-level languages that may be compiled into such instructions.

The computing device 500 may further include input/output (I/O) devices 508 (such as a display, soft keyboard, touch sensitive screen, image capture device, and so forth) and communication interfaces 510 (such as network interface cards, modems, infrared receivers, radio receivers (e.g., Near Field Communication (NFC), Bluetooth, WiFi, 5G/6G Long-Term Evolution (LTE), and so forth)).

The communication interfaces 510 may include communication chips (not shown) that may be configured to operate the device 500 in accordance with a Global System for Mobile Communication (GSM), General Packet Radio Service (GPRS), Universal Mobile Telecommunications System (UMTS), High Speed Packet Access (HSPA), Evolved HSPA (E-HSPA), or Long-Term Evolution (LTE) network. The communication chips may also be configured to operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chips may be configured to operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication interfaces 510 may operate in accordance with other wireless protocols in other embodiments.

In embodiments, various components of the computing device 500 may comprise the die 102 with the earlier described technology for integrally determining a parameter of a die. For example, the processor 502 may include at least some of the sensing devices 120 and 122 coupled with respective switches 130 and 133, and the components 112 and 115 of the control module 110. The digital output determination component 116 may be implemented, for example, as part of the computational logic 522. In embodiments, sensing devices 120 and 122 coupled with respective switches 130 and 133, and the components 112 and 115 of the control module 110 may be alternatively or additionally integrated into other components of computing device 500. For example, sensing devices 120 and 122 coupled with respective switches 130 and 133, and the components 112 and 115 of the control module 110 may be alternatively or additionally integrated into one of the dies of communication interface 510. As another example, sensing devices 120 and 122 coupled with respective switches 130 and 133, and the components 112 and 115 of the control module 110 may be alternatively or additionally integrated into one of the dies of mass storage 506 or one of the I/O devices 508.

The above-described computing device 500 elements may be coupled to each other via system bus 512, which may represent one or more buses. In the case of multiple buses, they may be bridged by one or more bus bridges (not shown). Each of these elements may perform its conventional functions known in the art.

The permanent copy of the programming instructions of computational logic 522 may be placed into mass storage devices 506 in the factory, or in the field, through, for example, a distribution medium (not shown), such as a compact disc (CD), or through communication interfaces 510 (from a distribution server (not shown)). That is, one or more distribution media having an implementation of the agent program may be employed to distribute the agent and to program various computing devices.

The number, capability, and/or capacity of the elements 508, 510, 512 may vary, depending on whether computing device 500 is used as a stationary computing device, such as a set-top box or desktop computer, or a mobile computing device, such as a tablet computing device, laptop computer, game console, or smartphone. Their constitutions are otherwise known, and accordingly will not be further described.

At least one of processors 502 may be packaged together with memory having computational logic 522. For one embodiment, at least one of processors 502 may be packaged together with memory having computational logic 522 to form a System in Package (SiP) or a System on Chip (SoC). For at least one embodiment, the SoC may be utilized to form the apparatus 100 of FIG. 1.

In various implementations, the computing device 400 may comprise a laptop, a netbook, a notebook, an ultrabook, a smartphone, a tablet, an ultra-mobile PC, a mobile phone, or a wearable device. In further implementations, the computing device 400 may be any other electronic device that processes data.

The embodiments of the present disclosure may be illustrated by the following examples.

Example 1 is an apparatus with integral determination of a parameter of a die, comprising: a die including a first area and a second area disposed at a distance from the first area; and circuitry to determine a parameter associated with the second area of the die, the circuitry including: a first sensing device disposed in the first area, to provide first readings associated with the parameter; a second sensing device disposed in the second area, to provide second readings associated with the parameter; and a control module coupled with the first and second sensing devices and disposed in the first area, to facilitate a determination of the parameter based at least in part on the first and second readings provided by the first and second sensing devices.

Example 2 may include the subject matter of Example 1, wherein the second area comprises a remote area of the die in which a central processing unit (CPU) or a graphics processor unit (GPU) is disposed.

Example 3 may include the subject matter of Example 2, wherein the first area comprises a local area of the die, wherein the second sensing device is disposed at least at the distance from the first sensing device, wherein the distance is about 500 micrometers.

Example 4 may include the subject matter of Example 3, wherein the remote area has a first density of electronic devices per unit of space that is above a first density threshold the local area has a second density of electronic devices per unit of space that is below a second density threshold, wherein the first density threshold is equal or greater than the second density threshold.

Example 5 may include the subject matter of Example 3, further comprising: a first switch coupled with the first sensing device; and a second switch coupled with the second sensing device, to enable selective connectivity of the first and second sensing devices with the control module.

Example 6 may include the subject matter of Example 5, wherein the control module to facilitate a determination of the parameter includes to: selectively connect the first and second sensing devices, with respective first and second switches, to the control module, to obtain the first and second readings from the first and second sensing devices; and generate first and second codes based at least in part on the provided first and second readings respectively, wherein the first and second codes are indicative of the parameter associated with the remote area of the die.

Example 7 may include the subject matter of Example 6, wherein the apparatus is associated with a controller, wherein the controller is to receive and post-process the first and second codes, to derive the parameter associated with the remote area of the die.

Example 8 may include the subject matter of Example 7, wherein the parameter comprises a temperature in the remote area of the die, wherein the first and second sensing device comprise digital temperature sensor circuit system (DTS).

Example 9 may include the subject matter of any of Examples 1 to 8, wherein the die comprises a semiconductor material, and the apparatus comprises an integrated circuit; and wherein the circuitry is disposed on the die.

Example 10 may include the subject matter of any of Examples 1 to 8, wherein the circuitry is disposed on the die to form an integrated circuit, wherein the apparatus is a computing device.

Example 11 is a method for integrally determining a parameter of a die, comprising: disposing a first sensing device in a first area of a die, to provide first readings associated with a parameter associated with the first area of the die; disposing a second sensing device in a second area of the die disposed at a distance from the first area, to provide second readings associated with the parameter associated with the first area of the die; disposing a control module in the first area, to control the first and second sensing devices to obtain the first and second readings from the first and second sensing devices; and providing a communication path between the first and second sensing devices and the control module, to facilitate a determination of the parameter based at least in part on the first and second readings provided by the first and second sensing devices to the control module.

Example 12 may include the subject matter of Example 11, wherein disposing the first sensing device and second sensing devices includes placing the second sensing device at least at the distance from the first sensing device.

Example 13 may include the subject matter of Example 11, further comprising: disposing a first switch to couple with the first sensing device, and disposing a second switch to couple with the second sensing device, to enable selective connection of the first and second sensing devices with the control module via the communication path using the first and second switches respectively, to obtain the first and second readings, and to generate first and second codes indicative of the parameter, based at least in part on the obtained first and second readings respectively.

Example 14 may include the subject matter of Example 13, further comprising: providing a communication path between the control module and a controller, to enable post-processing of the first and second codes, to derive the parameter associated with the remote area of the die.

Example 15 may include the subject matter of Example 11, wherein the parameter comprises a temperature in the second area of the die, wherein disposing the first and second sensing devices includes disposing a digital temperature sensor circuit system (DTS) that includes the first and second sensing devices.

Example 16 may include the subject matter of any of Examples 11 to 15, wherein the die comprises an integrated circuit.

Example 17 is a method for integrally determining a parameter of a die, comprising: causing, by a control module of a parameter determination circuitry disposed on a die, a provision of a first reading by a first sensing device of the circuitry disposed in a first area of the die; causing, by the control module, a provision of a second reading by a second sensing device of the circuitry disposed in a second area of a die located at a distance from the first area; and generating, by the control module, first and second codes indicative of the parameter, based at least in part on the provided respective first and second readings, to derive the parameter of the die based at least in part on the generated first and second codes.

Example 18 may include the subject matter of Example 17, further comprising: providing, by the control module, the first and second codes to a controller for post-processing and deriving the parameter based at least in part on the first and second codes.

Example 19 may include the subject matter of Example 17, wherein causing a provision of a first reading by a first sensing device and causing a provision of a second reading by a second sensing device include: selectively connecting, by the control module, the first and second sensing devices to the control module, to obtain the first and second readings from the first and second sensing devices.

Example 20 may include the subject matter of any of Examples 17 to 19, wherein the parameter comprises a temperature, wherein the first and second sensing devices are included in a digital temperature sensor circuit system (DTS).

Example 21 is a system with integral determination of a parameter of a die, comprising: a die including a first area and a second area disposed at a distance from the first area, wherein the die includes a central processing unit (CPU) or a graphics processor unit (GPU) that is substantially disposed in the second area; and circuitry to determine a parameter associated with the second area of the die, the circuitry including: a first sensing device disposed in the first area, to provide first readings associated with the parameter; a second sensing device disposed in the second area, to provide second readings associated with the parameter; and a control module coupled with the first and second sensing devices and disposed in the first area, to facilitate a determination of the parameter based at least in part on the first and second readings provided by the first and second sensing devices.

Example 22 may include the subject matter of Example 21, wherein the second area comprises a remote area of the die, wherein the first area comprises a local area of the die, wherein the second sensing device is disposed at least at the distance from the first sensing device.

Example 23 may include the subject matter of Example 22, further comprising: a first switch coupled with the first sensing device; and a second switch coupled with the second sensing device, to enable selective connectivity of the first and second sensing devices with the control module.

Example 24 may include the subject matter of Example 23, wherein the control module to facilitate a determination of the parameter includes to: selectively connect the first and second sensing devices, with respective first and second switches, to the control module, to obtain the first and second readings from the first and second sensing devices; and generate first and second codes based at least in part on the provided first and second readings respectively, wherein the first and second codes are indicative of the parameter associated with the remote area of the die.

Example 25 may include the subject matter of Example 24, wherein the parameter comprises a temperature in the remote area of the die, wherein the first and second sensing devices are included in a digital temperature sensor circuit system (DTS).

Various operations are described as multiple discrete operations in turn, in a manner that is most helpful in understanding the claimed subject matter. However, the order of description should not be construed as to imply that these operations are necessarily order dependent. Embodiments of the present disclosure may be implemented into a system using any suitable hardware and/or software to configure as desired.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims and the equivalents thereof.

What is claimed is:

1. An apparatus with integral determination of a parameter of a die, comprising:
   a die including a first area and a second area disposed at a distance and separate from the first area, wherein the first area has a first density of electronic devices per unit of space, and the second area has a second density of electronic devices per unit of space that is higher than the first density, wherein the second area includes a central processing unit (CPU) or a graphics processor unit (GPU); and
   circuitry to determine temperature in the second area of the die, the circuitry including: a first sensing device disposed in the first area, to provide first readings associated with the temperature in the first area; a second sensing device disposed in the second area, to provide second readings associated with the temperature in the second area; and a control module coupled with the first and second sensing devices and disposed in the first area, to facilitate a determination of the temperature in the second area based at least in part on the first and second readings provided by the first and second sensing devices.

2. The apparatus of claim 1, wherein the second sensing device is disposed at least at the distance from the first sensing device, wherein the distance is about 500 micrometers.

3. The apparatus of claim 2, wherein the first density of electronic devices per unit of space is below a first density threshold, wherein the second density of electronic devices per unit of space is above a second density threshold, wherein the first density threshold is equal to or lower than the second density threshold.

4. The apparatus of claim 2, further comprising:
   a first switch coupled with the first sensing device; and
   a second switch coupled with the second sensing device, to enable selective connectivity of the first and second sensing devices with the control module.

5. The apparatus of claim 4, wherein the control module is to:
   selectively connect the first and second sensing devices, with respective first and second switches, to the control module, to obtain the first and second readings from the first and second sensing devices; and
   generate first and second codes based at least in part on the provided first and second readings respectively, wherein the first and second codes are indicative of the temperature associated with the second area of the die.

6. The apparatus of claim 5, wherein the apparatus is associated with a controller, wherein the controller is to receive and post-process the first and second codes, to derive the temperature in the second area of the die.

7. The apparatus of claim 6, wherein the first and second sensing device comprise a digital temperature sensor circuit system (DTS).

8. The apparatus of claim 1, wherein the die comprises a semiconductor material, and the apparatus comprises an integrated circuit; and wherein the circuitry is disposed on the die.

9. The apparatus of claim 1, wherein the circuitry is disposed on the die to form an integrated circuit, wherein the apparatus is a computing device.

10. A system with integral determination of a parameter of a die, comprising:
    a computing device having a central processing unit (CPU);
    a die including a first area and a second area disposed at a distance from the first area, wherein the (CPU) is substantially disposed in the second area of the die, wherein the first area has a first density of electronic devices per unit of space, and the second area has a second density of electronic devices per unit of space that is higher than the first density; and
    circuitry to determine a temperature in the second area of the die, the circuitry including: a first sensing device disposed in the first area, to provide first readings associated with the temperature in the first area; a second sensing device disposed in the second area, to provide second readings associated with the temperature in the second area; and a control module coupled with the first and second sensing devices and disposed in the first area, to facilitate a determination of the temperature in the second area based at least in part on the first and second readings provided by the first and second sensing devices.

11. The system of claim 10, wherein the second sensing device is disposed at least at the distance from the first sensing device.

12. The system of claim 11, further comprising:
    a first switch coupled with the first sensing device; and
    a second switch coupled with the second sensing device, to enable selective connectivity of the first and second sensing devices with the control module.

13. The system of claim 12, wherein the control module to facilitate a determination of the parameter includes to:
    selectively connect the first and second sensing devices, with respective first and second switches, to the control module, to obtain the first and second readings from the first and second sensing devices; and
    generate first and second codes based at least in part on the provided first and second readings respectively, wherein the first and second codes are indicative of the temperature in the second area of the die.

14. The system of claim 13 wherein the first and second sensing devices are included in a digital temperature sensor circuit system (DTS).

* * * * *